United States Patent
Rudberg

(10) Patent No.: US 7,474,883 B2
(45) Date of Patent: Jan. 6, 2009

(54) RADIO COMMUNICATION RECEIVED HAVING AUTOMATIC GAIN CONTROL BASED ON MEASURED AND RECEIVED ENERGY

(75) Inventor: Mikael Rudberg, Linkoping (SE)

(73) Assignee: Infineon Technologies AG (JP)

( * ) Notice: Subject to any disclaimer, the term of this patent is extended or adjusted under 35 U.S.C. 154(b) by 492 days.

(21) Appl. No.: 11/147,418

(22) Filed: Jun. 6, 2005

(65) Prior Publication Data

US 2005/0272390 A1    Dec. 8, 2005

(30) Foreign Application Priority Data

Jun. 7, 2004   (EP)   .................................. 04013390

(51) Int. Cl.
*H04B 7/00* (2006.01)
(52) U.S. Cl. ................. 455/234.2; 455/234.1; 455/136; 455/138; 375/345; 375/348
(58) Field of Classification Search .............. 455/234.2, 455/234.1, 232.1–253.2, 226.1–226.4, 425, 455/426, 456.5, 456.6, 561, 550.1, 575.1, 455/412.1, 418–420, 186.1, 557, 67.11, 127.1, 455/136, 138, 296; 375/345, 340; 330/278, 330/254; 348/678, 685
See application file for complete search history.

(56) References Cited

U.S. PATENT DOCUMENTS

| | | | |
|---|---|---|---|
| 6,148,189 A * | 11/2000 | Aschwanden ............. | 455/234.1 |
| 6,836,647 B2 * | 12/2004 | Rimini et al. ............. | 455/226.2 |
| 6,961,552 B2 * | 11/2005 | Darabi et al. ............. | 455/241.1 |
| 7,245,893 B1 * | 7/2007 | Husted et al. ............. | 455/226.3 |
| 2002/0163979 A1 * | 11/2002 | Takatz et al. ................. | 375/345 |
| 2004/0063413 A1 * | 4/2004 | Schaffer et al. ........... | 455/234.1 |
| 2004/0185808 A1 * | 9/2004 | Chow ....................... | 455/127.2 |
| 2006/0211391 A1 * | 9/2006 | Nishikawa et al. ........ | 455/226.1 |
| 2007/0243841 A1 * | 10/2007 | Husted et al. ............. | 455/226.3 |

FOREIGN PATENT DOCUMENTS

| | | |
|---|---|---|
| EP | 1 303 053 A1 | 4/2003 |
| WO | WO-02/091104 A2 | 11/2002 |
| WO | WO-2004/047323 A1 | 6/2004 |

* cited by examiner

*Primary Examiner*—Edward Urban
*Assistant Examiner*—Charles Chow
(74) *Attorney, Agent, or Firm*—Dickstein, Shapiro, LLP.

(57) ABSTRACT

A receiver in a radio communication system and method for optimizing a use of an available dynamic range. The receiver has an automatic gain controller in an automatic gain control loop, a first measuring device, connected to the automatic gain controller, operable to measure a total received energy, a second measuring device, connected to the automatic gain controller, operable to measure the inband signal energy, wherein the automatic gain controller is operable to adjust the gain based on both the total received energy and the inband signal energy.

11 Claims, 8 Drawing Sheets

PRIOR ART

PRIOR ART

FIG 8
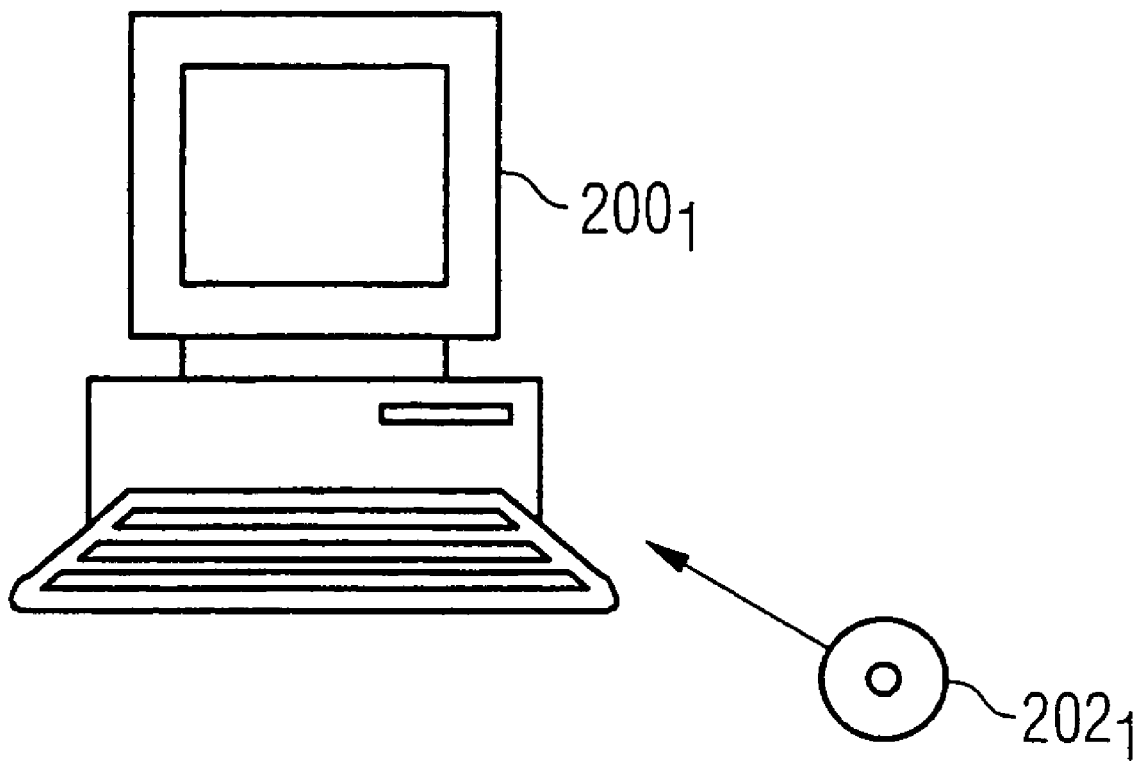
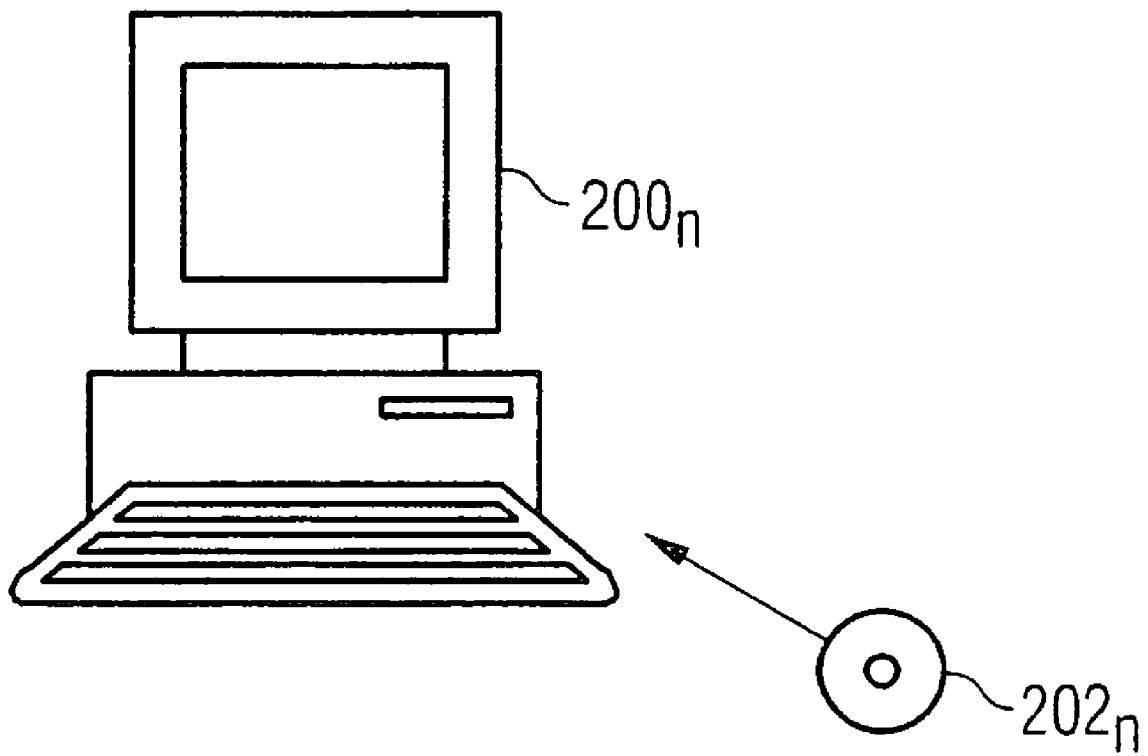

RADIO COMMUNICATION RECEIVED HAVING AUTOMATIC GAIN CONTROL BASED ON MEASURED AND RECEIVED ENERGY

CROSS-REFERENCE TO THE RELATED APPLICATION

This application claims priority from European Patent Application No. 04013390.2, which was filed on Jun. 7, 2004 and is incorporated herein by reference in its entirety.

FIELD OF THE INVENTION

The present invention to a receiver in a radio communication system, and a method and a computer program product for optimising the use of the available dynamic range in the receiver.

BACKGROUND OF THE INVENTION

Wireless LAN systems have the drawback of having to operate with a strong adjacent channel energy. Due to the channel spacing it is difficult to remove all adjacent channel energy using analogue filters, causing a substantial amount of energy being present at the input of the A/D converters in a WLAN receiver in the worst case. To cope with this the A/D converters are usually run at a higher conversion rate than needed for the inband signal only. Usually 2-4 times oversampling is used in order to being able to use digital filtering to remove the $1^{st}$ and possibly the second adjacent channel. A typical budget for a WLAN system A/D converters is shown in FIG. 1.

In FIG. 1 there is disclosed a typical WLAN A/D converter dynamic range budget, wherein A represents the range required for signal energy, B represents the adjacent channel energy, C represents the crest factor headroom and D represents the inband noise etc.

When a frame is received a gain control loop (AGC) is running in order to adjust the gain in the receiver to achieve an optimal signal level at the input of the A/D converters. Here there are two possibilities:

The received signal contains adjacent channel interference.
The received signal does not contain (or only has minor) adjacent channel inference.

Since a typical AGC loop measures the received signal energy and sets the gain for maximum utilization of the available dynamic range there will be a problem if the adjacent channel interference increase after the AGC loop is finished but before the entire frame is received. If this situation occurs the signal will start to clip, producing inband noise and seriously reducing the performance. See FIG. 2.

In FIG. 2 there is disclosed the adjacent interference starting after AGC freeze, wherein E represents the start of the frame, F represents the adjacent channel transmission start causing severe clipping noise, and G represents the to end of the frame.

In FIG. 3 there is disclosed the A/D converter dynamic range budget, wherein the clip level is 54 dB, meaning that B, the adjacent channel energy will overload the A/D converter which will cause clipping. The reference signs used in FIG. 3 correspond to the reference signs used in FIG. 1.

SUMMARY OF THE INVENTION

An object of the present invention is to solve the above mentioned problems. The receiver according to the present invention is comprised in a radio communication system. The receiver is operable to optimise the use of the available dynamic range. The receiver includes an automatic gain control means in an automatic gain control loop, a first measurement means, which is connected to the automatic gain control means and is operable to measure the total received energy, a second measurement means, which is connected to the automatic gain control means and is operable to measure the inband signal energy, wherein the automatic gain control means is operable to adjust the gain based on both the total received energy and the inband signal energy.

A method according to the present invention for optimising the use of the available dynamic range in a receiver comprised in a radio communication system. The method includes the steps of measuring the total received energy, measuring the inband signal energy, and adjusting the gain in an automatic gain control loop based on both the total received energy and the inband signal energy.

At least one computer program product according to the present invention is/are directly loadable into the internal memory of at least one digital computer, including software code portions for performing the method steps discussed above when the at least one product is/are run on the at least one computer.

BRIEF DESCRIPTION OF THE DRAWINGS

The present invention will in the following by way of embodiments be described in more detail, in conjunction with the enclosed drawings, in which:

FIG. 8 show some examples of computer program products according to the present invention.

DETAILED DESCRIPTION OF THE PREFERRED EMBODIMENTS

An advantage of the receiver according to the present invention is that it is possible to use the available dynamic range in a more optimal way.

Another advantage is a substantial improvement of radio communication systems with many adjacent interferers, as for instance airports.

Figure 1:
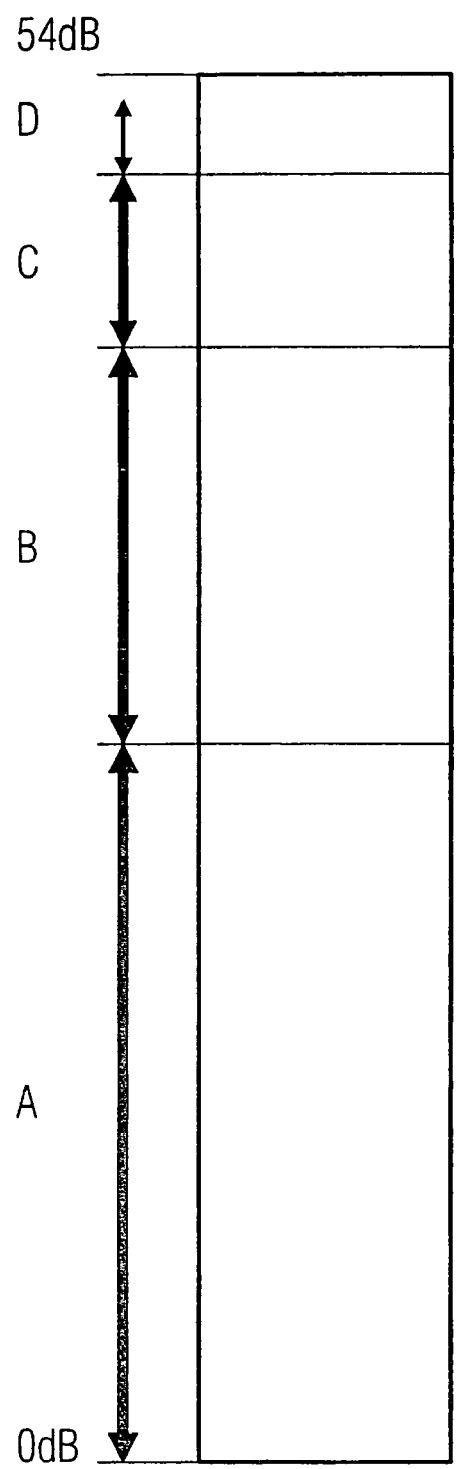
FIG. 1 shows a typical dynamic range budget for WLAN system A/D converters.
Figure 2:
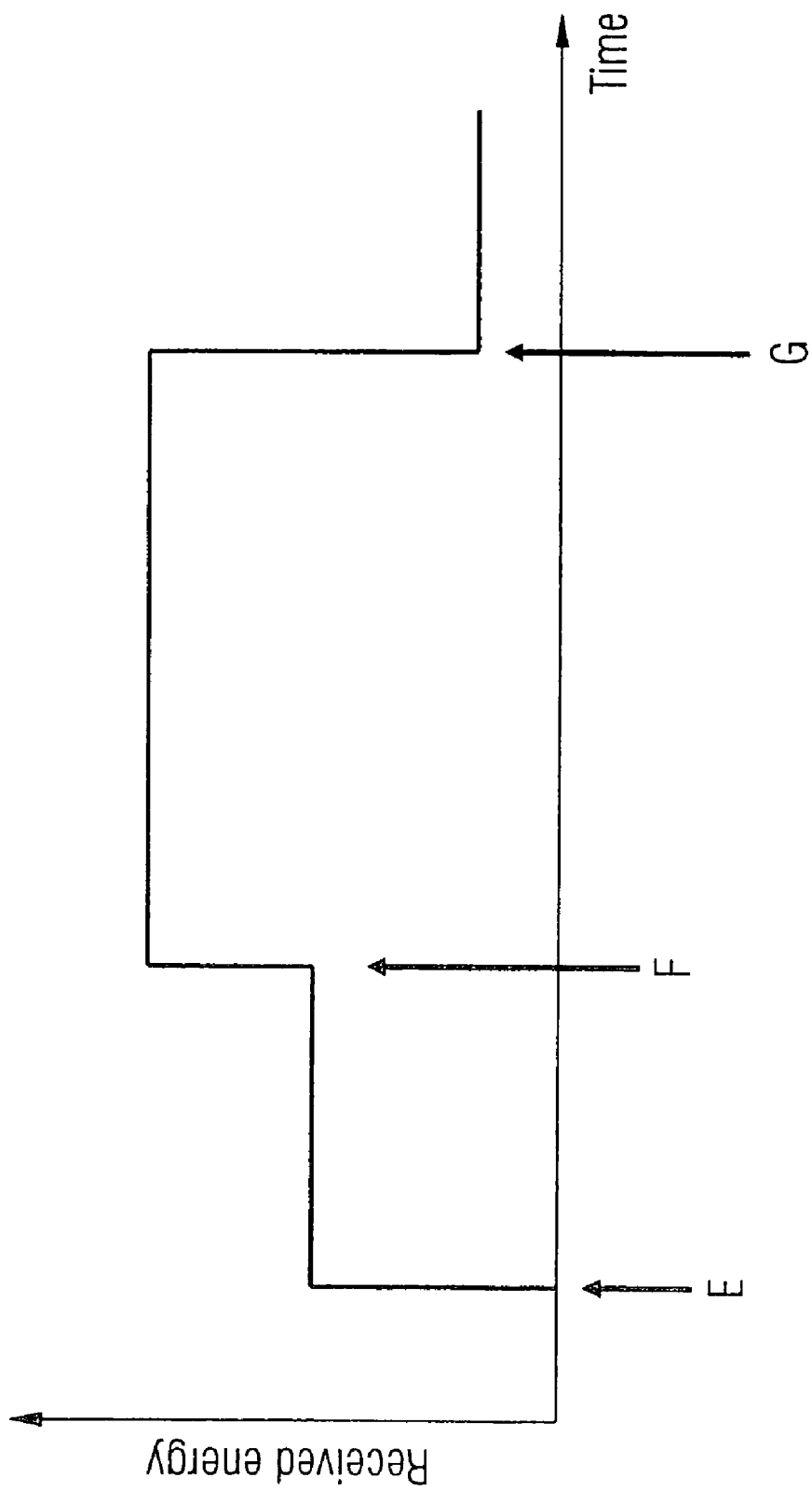
FIG. 2 shows a diagram of adjacent interference starting after AGC freeze.
Figure 3:
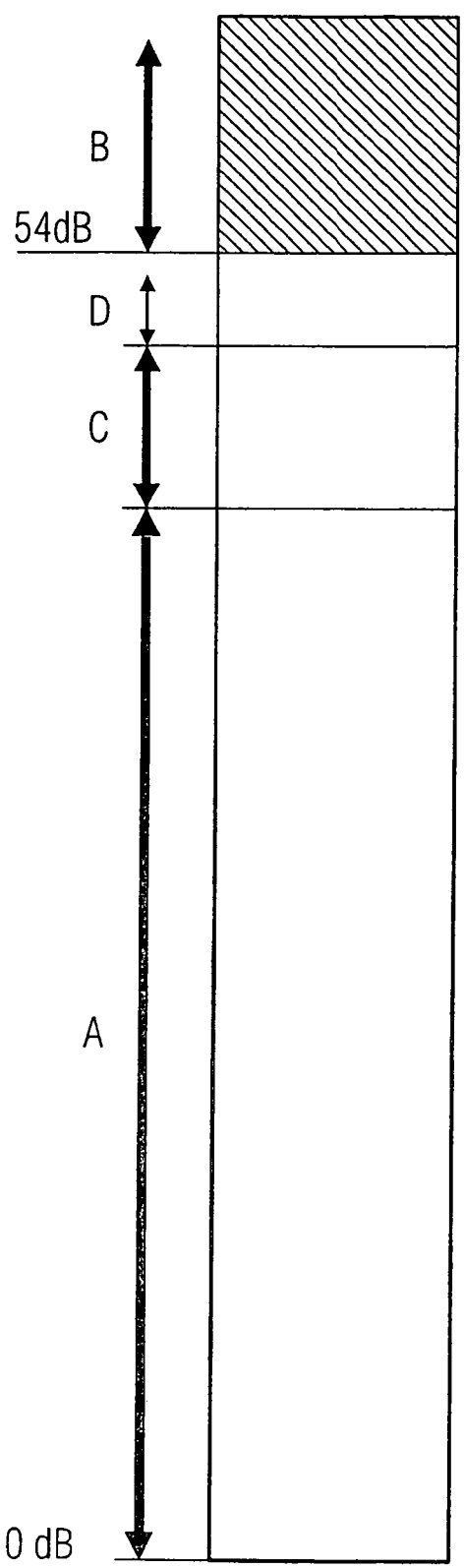
FIG. 3 shows a typical dynamic range budget for WLAN system A/D converters with clipping.
Figure 4:
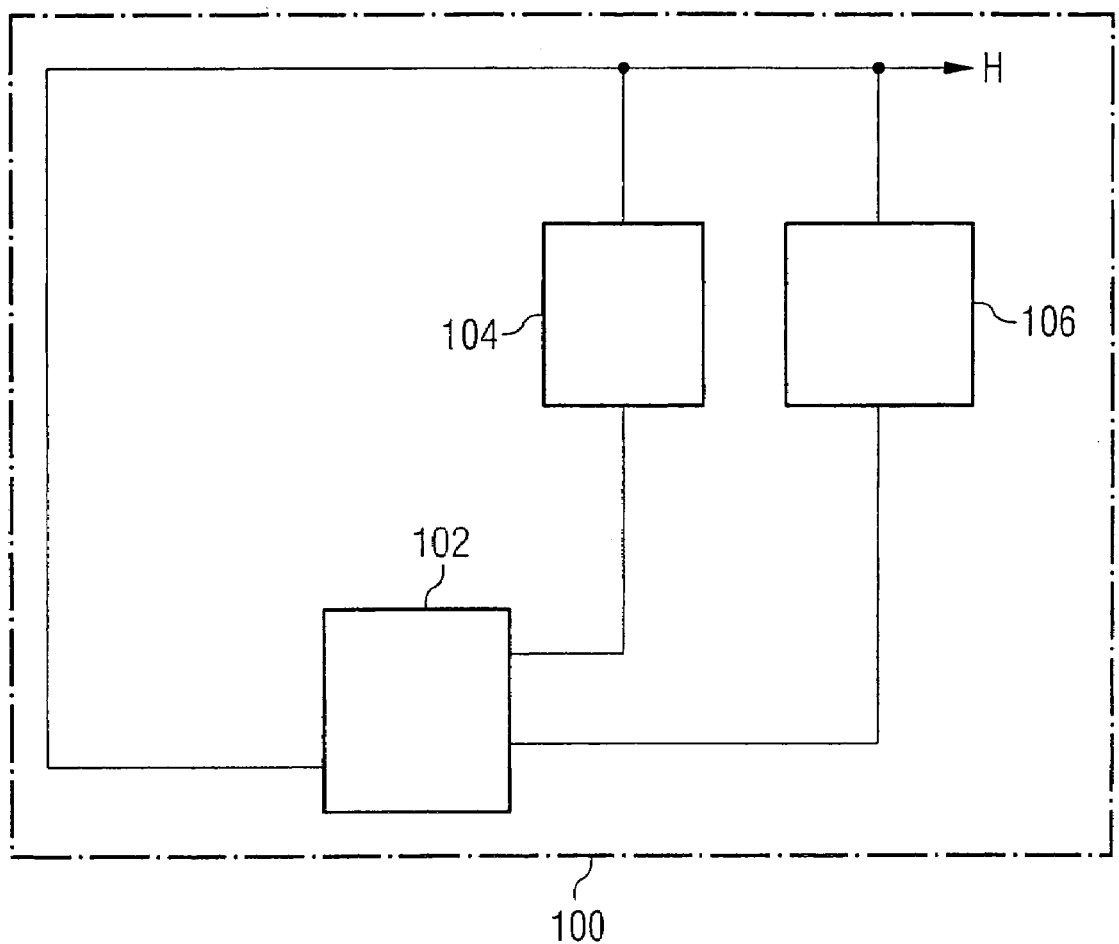
FIG. 4 is a block diagram of a receiver according to the present invention.

In FIG. 4 there is disclosed a block diagram of a receiver 100 according to the present invention. The receiver 100 is comprised in a radio communication system. The receiver 100 is operable to optimise the use of the available dynamic range. The receiver 100 includes an automatic gain control means 102 in an automatic gain control loop. The receiver 100 also includes the automatic gain control means 102 connected a first measurement means 104 operable to measure the total received energy. The receiver 100 also includes a second measurement means 106 connected to the automatic gain control means 102. The second measurement means 106 is operable to measure the inband signal energy. The automatic gain control means 102 is operable to adjust the gain in dependence of both the total received energy and the inband signal energy. The reference sign H represents the output signal of the receiver 100.

The radio communication system mentioned in this description can, e.g., be operated in accordance with one of the following radio standards: wireless LAN (i.e. IEEE802.11a/b/g), Hiperlan 1 and 2, Bluetooth, GSM/GSM-GPRS, WCDMA, and CDMA 2000.

Figure 5:
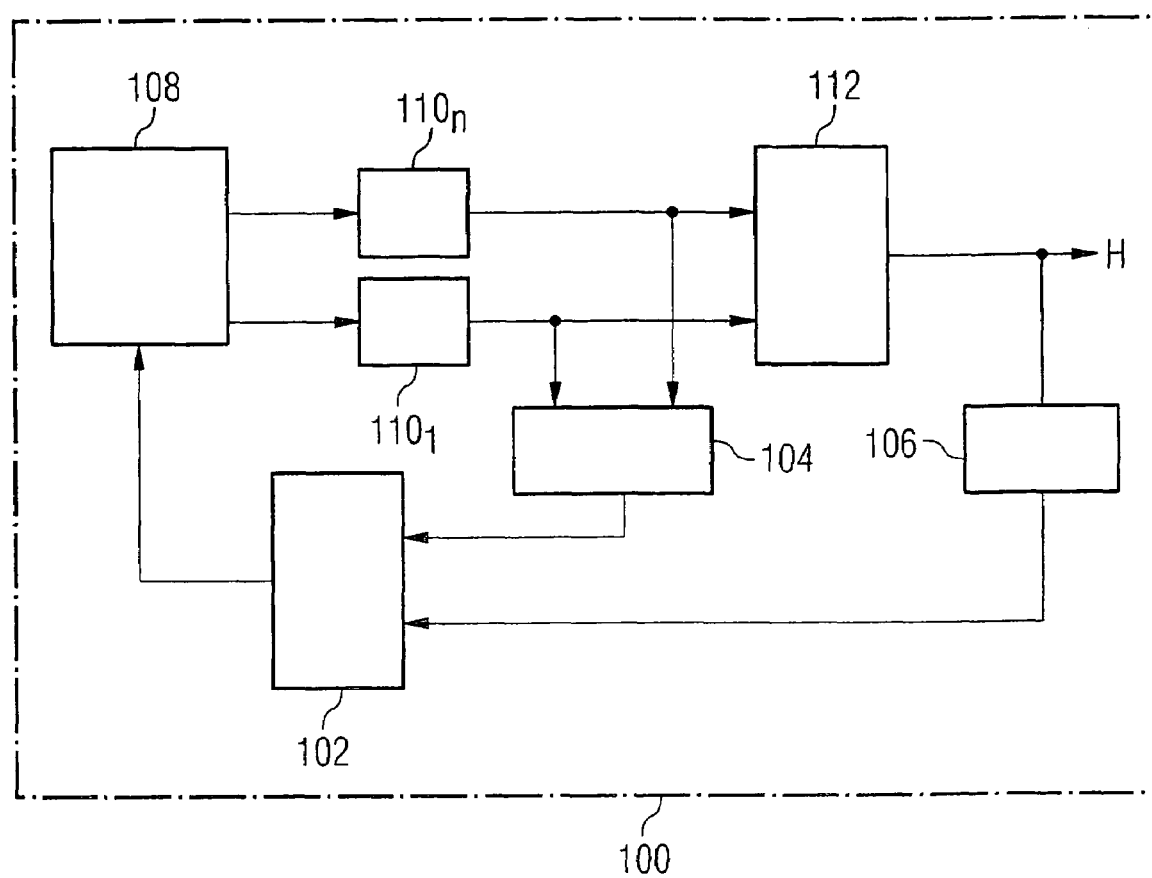
FIG. 5 is a more detailed block diagram of the receiver disclosed in FIG. 4.

In FIG. 5 there is disclosed a more detailed block diagram of the receiver 100 disclosed in FIG. 4. Some of the means/functional blocks in FIG. 5 correspond to the same means/functional blocks in FIG. 4 and these have been allocated the same reference signs in both FIG. 4 and FIG. 5 and will not be described again. The receiver 100 disclosed in FIG. 5 also comprises the automatic gain control means 102 connected to a radio frequency means 108 included in the automatic gain control loop. The radio frequency means 108 receives the adjusted gain from the automatic gain control means 102. The receiver 100 also includes at least one A/D converter means $110_1, \ldots, 110_n$ connected to the radio frequency means 108. The at least one A/D converter means $110_1, \ldots, 110_n$ is/are also connected to the first measurement means 104. The receiver 100 also includes a filter means 112 connected to the A/D converter means $110_1, \ldots, 110_n$ and to the second measurement means 106.

In a preferred embodiment of the receiver 100, the automatic gain control means 102 adjusts the gain in such a way that the inband signal energy, IE, comes close to a target inband energy, SE.

In a preferred embodiment of the receiver 100, the automatic gain control means 102 sets the target inband energy, SE, in accordance with the expression:

$$(SE) = \begin{cases} IE & \text{if } AE \leq \text{MAX\_AE} \\ IE - (AE - \text{MAX\_AE}) & \text{if } AE > \text{MAX\_AE} \end{cases}$$

wherein AE=TE−IE is the adjacent energy and TE is the total energy, and MAX_AE is the maximum allowable level of the adjacent energy (AE).

Both total received energy and inband energy estimates are fed to the AGC block. Common solutions use only the measured energy from the total energy measurements to set the gain. That is the gain is adjusted until the total energy (TE) reading is the same, or close to some target level GE.

In the proposed solution the gain is instead adjusted so that the inband signal gets enough dynamic range. That is, the inband signal energy (IE) shall be close to the optimal signal energy level (SE). With this gain target we can handle varying adjacent channel interference even after a gain freeze.

Only if the adjacent channel interference is stronger than the maximum allowable level the signal is clipping at the A/D converter. This can be handled by adjusting the gain target slightly. If the adjacent energy (AE=TE−IE) is higher than what can be handled, the gain is reduced by this amount. That is, the new target input energy is:

$$\text{target band energy } (SE) = \begin{cases} IE & \text{if } AE \leq \text{MAX\_AE} \\ IE - (AE - \text{MAX\_AE}) & \text{if } AE > \text{MAX\_AE} \end{cases}$$

Figure 6:
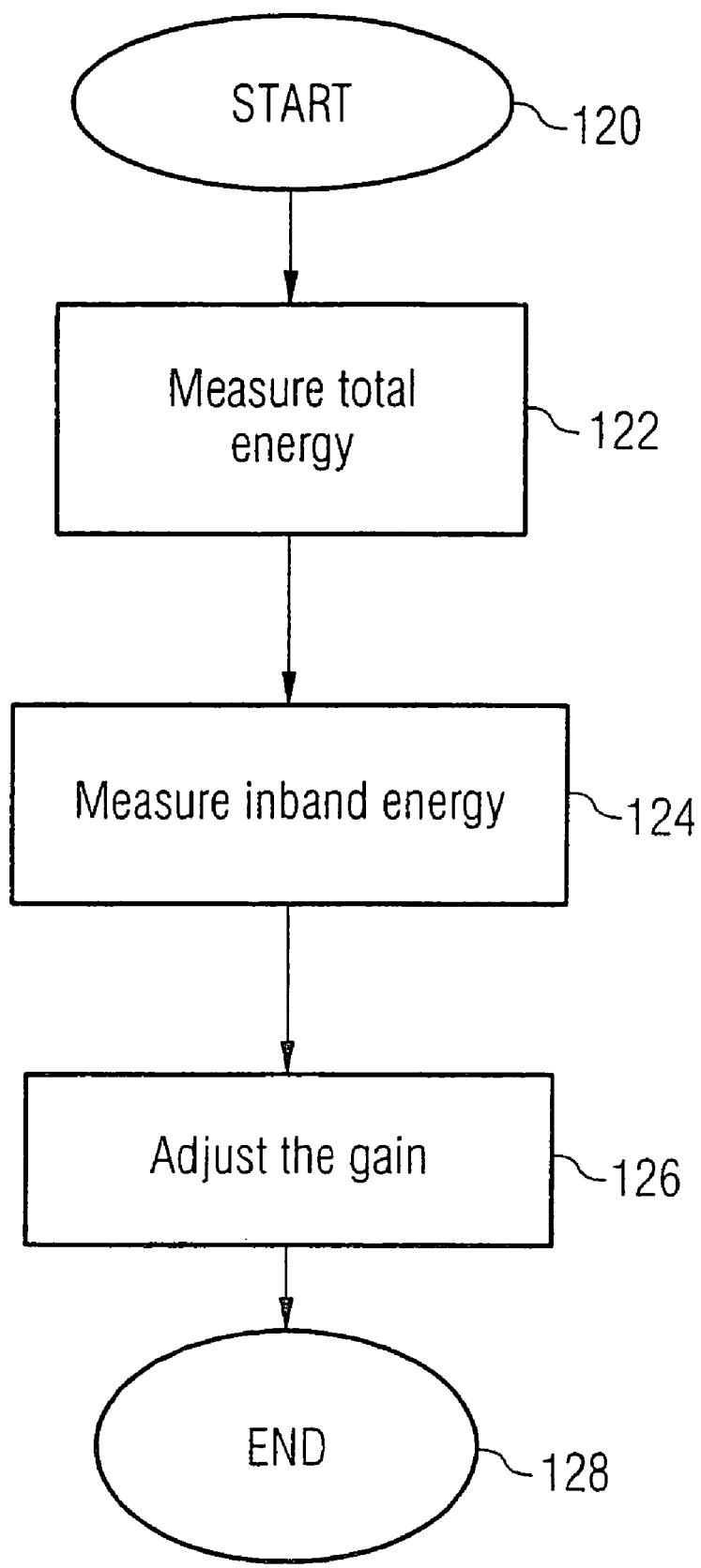
FIG. 6 is a flow chart of a method for optimising the use of the available dynamic range in a receiver comprised in a radio communication system according to the present invention.

In FIG. 6 there is disclosed a flow chart of the method for optimising the use of the available dynamic range in a receiver comprised in a radio communication system. The method begins at block 120. The method continues, at block 122, with the step of measuring the total received energy. Thereafter, the method continues, at block 124, with the step of measuring the inband signal energy. The method continues, at block 126, with the step of adjusting the gain in an automatic gain control loop in dependence of both the total received energy and the inband signal energy. The method is finished at block 128.

Figure 7:
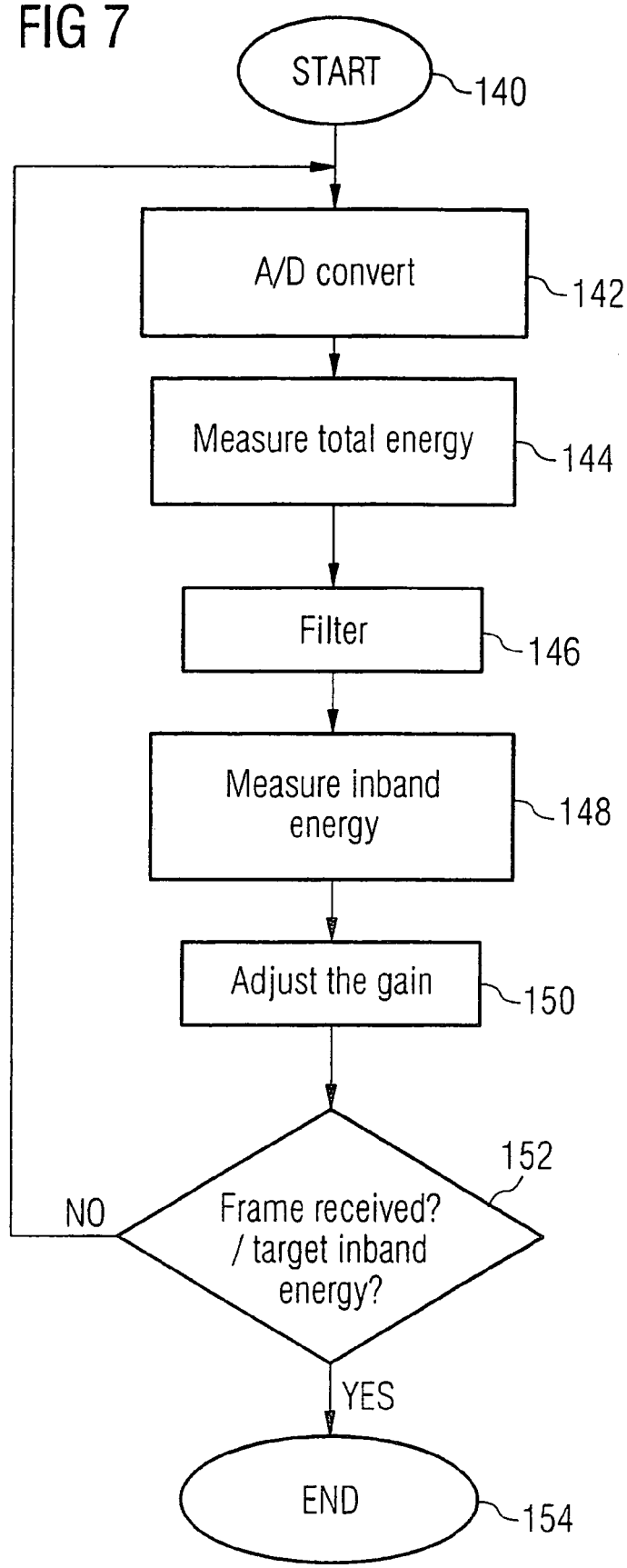
FIG. 7 is a more detailed flow chart of the method disclosed in FIG. 6.

In FIG. 7 there is disclosed a more detailed flow chart of the method disclosed in FIG. 6. The method begins at block 140. The method continues, at block 142, with the step of A/D converting the received signal. This step can be performed in one single step, or be divided into several A/D conversion steps performed in parallel. See FIG. 5. Thereafter, the method continues, at block 144, with the step of measuring the total received energy. The method continues, at block 146, with the step of filtering the A/D converted signal. Thereafter, the method continues, at block 148, with the step of measuring the inband signal energy. The method continues, at block 150, with the step of adjusting the gain in an automatic gain control loop in dependence of both the total received energy and the inband signal energy. Thereafter the method continues, at block 152, with the question of whether the entire frame received. If the answer is negative the method continues by performing the step according to block 142 again. If, on the other hand, the answer is affirmative, the method continues, at block 154, with the step of finishing the method.

According to another embodiment, the method continues at block 152, with the question of whether IE is sufficiently close to the target inband energy (SE). If the answer is negative the method continues by performing the step according to block 142 again. If, on the other hand, the answer is affirmative, the method continues, at block 154, with the step of finishing the method.

According to another embodiment, the method continues, at block 152, with the question of whether the current time ≧ a time threshold. If the answer is negative, the method continues by performing the step according to block 142 again. If, on the other hand, the answer is affirmative, the method continues, at block 154, with the step of finishing the method. This solution implies that the gain will be locked within a certain time limit, the time threshold.

In a preferred embodiment, the method also comprises the step of adjusting the gain in such a way that the inband signal energy (IE) comes close to a target inband energy (SE).

In a preferred embodiment, the method also comprises the step:

$$(SE) = \begin{cases} IE & \text{if } AE \leq \text{MAX\_AE} \\ IE - (AE - \text{MAX\_AE}) & \text{if } AE > \text{MAX\_AE} \end{cases}$$

wherein AE=TE−IE is the adjacent energy and TE is the total energy, and MAX_AE is the maximum allowable level of the adjacent energy (AE).

In FIG. 8 there is disclosed a schematic diagram of some computer program products according to the present invention. There is disclosed n different digital computers $200_1, \ldots, 200_n$, wherein n is an integer. There is also disclosed n different computer program products $202_1, \ldots, 202_n$, here showed in the form of compact discs. The different computer program products $202_1, \ldots 202_n$ are directly loadable into the internal memory of the n different digital computers $200_1, \ldots, 200_n$. Each computer program product $202_1, \ldots, 202_n$ comprises software code portions for performing some or all the steps of FIG. 6 when the product(s) $202_1, \ldots, 202_n$ is/are run on the computer(s) $200_1, \ldots, 200_n$. The computer program products $202_1, \ldots, 202_n$ can, e.g., be in the form of floppy disks, RAM disks, magnetic tapes, opto-magnetic disks, or any other suitable product.

The invention is not limited to the embodiments described in the foregoing. It will be obvious that many different modifications are possible within the scope of the following claims.

What is claimed is:

1. A receiver in a radio communication system configured to optimize use of an available dynamic range, comprising:
    an automatic gain controller in an automatic gain control loop;
    a first measuring device coupled to the automatic gain controller and configured to measure a total received energy; a second measuring device coupled to the automatic gain controller and configured to measure an inband signal energy,
    wherein the automatic gain controller sets a target inband energy in accordance with the expression:

$$(SE) = \begin{cases} IE & \text{if } AE \leq \text{MAX\_AE} \\ IE - (AE - \text{MAX\_AE}) & \text{if } AE > \text{MAX\_AE} \end{cases}$$

wherein $AE = TE - IE$ is the adjacent energy and TE is the total energy, and MAX_AE is the maximum allowable level of the adjacent energy (AE), and
    wherein the automatic gain controller is configured to adjust the gain based on the total received energy, the inband signal energy and the target inband signal enemy, such that the inband signal enemy comes close to the target inband energy.

2. The receiver according to claim 1, further comprising a radio frequency device coupled to the automatic gain controller and comprised in the automatic gain control loop, wherein the radio frequency device receives an adjusted gain from the automatic gain controller.

3. The receiver according to claim 2, further comprising:
    at least one A/D converter coupled to the radio frequency device and to the first measuring device; and
    a filter coupled to the A/D converter and to the second measuring device.

4. A receiver in a radio communication system configured to optimize use of an available dynamic range, comprising:
    an automatic gain control means in an automatic gain control loop;
    a first measurement means, coupled to the automatic gain control means, for measuring a total received energy; a second measurement means, coupled to the automatic gain control means, for measuring an inband signal energy,
    wherein the automatic gain control means sets a target inband energy in accordance with the expression:

$$(SE) = \begin{cases} IE & \text{if } AE \leq \text{MAX\_AE} \\ IE - (AE - \text{MAX\_AE}) & \text{if } AE > \text{MAX\_AE} \end{cases}$$

wherein $AE = TE - IE$ is the adjacent energy and TE is the total energy, and MAX_AE is the maximum allowable level of the adjacent energy (AE), and
    wherein the automatic gain means adjusts the gain based on the total received energy, the inband signal energy and the target inband signal energy, such that the inband signal energy comes close to the target inband energy.

5. The receiver according to claim 4, further comprising a radio frequency means coupled to the automatic gain control means and comprised in the automatic gain control loop, wherein the radio frequency means receives an adjusted gain from the automatic gain control means.

6. The receiver according to claim 5, further comprising:
    at least one AID converter means coupled to the radio frequency means and to the first measurement means; and
    a filter means coupled to the A/D converter means and to the second measurement means.

7. A method for optimizing a use of an available dynamic range in a receiver comprised in a radio communication system, the method comprising:
    measuring a total received energy;
    measuring an inband signal energy;
    setting a target inband energy in accordance with the expression:

$$(SE) = \begin{cases} IE & \text{if } AE \leq \text{MAX\_AE} \\ IE - (AE - \text{MAX\_AE}) & \text{if } AE > \text{MAX\_AE} \end{cases}$$

wherein $AE = TE - IE$ is the adjacent energy and TE is the total energy, and MAX_AE is the maximum allowable level of the adjacent energy; and
    adjusting a gain in an automatic gain control loop based on the total received energy, the inband signal energy and the target inband energy, wherein the inband signal energy comes close to the target inband energy.

8. The method according to claim 7, further comprising:
    A/D converting a received signal; and
    filtering the A/D converted signal.

9. At least one computer executable program product stored on an internal memory of at least one digital computer, comprising software code portions for performing the method of claim 7 when the at least one product is run on the at least one computer.

10. A computer executable program stored on a computer readable medium having a program code for performing a method for receiving instructions, comprising: (a) measuring a total received energy; (b) measuring an inband signal energy; (c) setting a target inband energy in accordance with the expression:

$$(SE) = \begin{cases} IE & \text{if } AE \leq \text{MAX\_AE} \\ IE - (AE - \text{MAX\_AE}) & \text{if } AE > \text{MAX\_AE} \end{cases}$$

wherein $AE = TE - IE$ is the adjacent energy and TE is the total energy, and MAX—AE is the maximum allowable level of the adjacent energy (AE), and (d) adjusting a gain in an automatic gain control loop based on the total received energy, the inband signal energy and the target inband signal energy, such that the inband signal enemy comes close to a target inband energy.

11. A receiver in a radio communication system configured to optimize a use of an available dynamic range, the receiver comprising:
    a processor;
    a memory communicatively coupled to the processor; and
    software executing in the processor configured to:

a) measure a total received energy;
b) measure an inband signal energy;
c) set a target inband energy in accordance with the expression:

$$(SE) = \begin{cases} IE & \text{if } AE \leq \text{MAX\_AE} \\ IE - (AE - \text{MAX\_AE}) & \text{if } AE > \text{MAX\_AE} \end{cases}$$

wherein $AE = TE - IE$ is the adjacent energy and TE is the total energy, and MAX_AE is the maximum allowable level of the adjacent energy (AE); and d) adjust a gain in an automatic gain control loop based on the total received energy, the inband signal enemy and the target inband signal enemy, such that the inband signal energy comes close to a target inband energy.

* * * * *

UNITED STATES PATENT AND TRADEMARK OFFICE
CERTIFICATE OF CORRECTION

PATENT NO. : 7,474,883 B2  Page 1 of 1
APPLICATION NO. : 11/147418
DATED : January 6, 2009
INVENTOR(S) : Mikael Rudberg It is certified that error appears in the above-identified patent and that said Letters Patent is hereby corrected as shown below:

In the Specification:

Col. 1, line 56, after "the" delete "to".

Col. 5, line 36, Claim 1, delete "enemy," and insert -- energy, --, therefor.

Col. 5, line 37, In Claim 1, delete "enemy" and insert -- energy --, therefor.

Col. 6, line 11, In Claim 6, delete "AID" and insert -- A/D --, therefor.

Col. 6, line 60, In Claim 10, delete "enemy" and insert -- energy --, therefor.

Col. 8, line 5, In Claim 11, delete "enemy" and insert -- energy --, therefor.

Col. 8, line 6, In Claim 11, delete "enemy," and insert -- energy, --, therefor.

Signed and Sealed this

Seventh Day of April, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,474,883 B2  
APPLICATION NO. : 11/147418  
DATED : January 6, 2009  
INVENTOR(S) : Mikael Rudberg Page 1 of 1

It is certified that error appears in the above-identified patent and that said Letters Patent is hereby corrected as shown below:

Title Page, item (73), Assignee, delete "(JP)" and insert -- (DE) --, therefor.

Signed and Sealed this
Eleventh Day of October, 2011

David J. Kappos
*Director of the United States Patent and Trademark Office*